United States Patent
Chadwick et al.

(10) Patent No.: US 6,430,072 B1
(45) Date of Patent: Aug. 6, 2002

(54) EMBEDDED CAM TEST STRUCTURE FOR FULLY TESTING ALL MATCHLINES

(75) Inventors: Thomas B. Chadwick, Essex Junction; Rahul K. Nadkarni, Colchester; Michael R. Ouellette, Westford; Jeremy P. Rowland, South Burlington, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/682,638

(22) Filed: Oct. 1, 2001

(51) Int. Cl.[7] .............................................. G11C 15/00
(52) U.S. Cl. ...................... 365/49; 365/189.07; 365/201
(58) Field of Search .............................. 365/49, 189.07, 365/230.06, 230.02, 201

(56) References Cited

U.S. PATENT DOCUMENTS

| | | |
|---|---|---|
| 4,559,618 A | 12/1985 | Houseman et al. |
| 4,680,760 A | 7/1987 | Giles et al. |
| 5,107,501 A | 4/1992 | Zorian |
| 5,220,526 A * | 6/1993 | Giles et al. ................... 365/49 |
| 5,550,974 A | 8/1996 | Pennington et al. |
| 5,796,758 A | 8/1998 | Levitan |
| 5,841,874 A * | 11/1998 | Kempke et al. ............... 380/50 |
| 5,920,886 A | 7/1999 | Feldmeier |
| 5,999,435 A | 12/1999 | Henderson et al. |
| 6,122,710 A | 9/2000 | Kumar et al. |
| 6,137,707 A | 10/2000 | Srinivasan et al. |
| 6,148,364 A | 11/2000 | Srinivasan et al. |
| 6,157,558 A | 12/2000 | Wong |
| 6,166,938 A | 12/2000 | Wong |
| 6,188,594 B1 | 2/2001 | Ong |
| 6,222,752 B1 | 4/2001 | Kumar et al. |
| 6,240,485 B1 * | 5/2001 | Srinivasan et al. .......... 711/108 |
| 6,324,087 B1 * | 11/2001 | Pereira ........................ 365/49 |

* cited by examiner

Primary Examiner—David Nelms
Assistant Examiner—Thong Le
(74) Attorney, Agent, or Firm—McGinn & Gibb, PLLC; Richard A. Henkler, Esq.

(57) ABSTRACT

A method and structure for content addressable memory structure having a memory array of words, each word having multiple memory bits and a plurality of matchlines. Each of the matchlines is connected to one of the words and a matchline compare circuit is connected to the matchlines and is adapted to test all of the words individually. The matchline compare circuit includes a plurality of comparators equal in number to a number of the words, such that each word is connected to a dedicated comparator to allow each word in the memory array to be individually tested.

17 Claims, 6 Drawing Sheets

| OPERATION | WRITE DATA | SEARCH DATA | NUMBER OF CYCLES |
|---|---|---|---|
| WRITE TO EACH ADDRESS | 00000000 | XXXXXXXX | 64 |
| SEARCH (ALL ADDRESSES) | XXXXXXXX | 10000000 | 1 |
| SEARCH | XXXXXXXX | 01000000 | 1 |
| SEARCH | XXXXXXXX | 00100000 | 1 |
| SEARCH | XXXXXXXX | 00010000 | 1 |
| SEARCH | XXXXXXXX | 00001000 | 1 |
| SEARCH | XXXXXXXX | 00000100 | 1 |
| SEARCH | XXXXXXXX | 00000010 | 1 |
| SEARCH | XXXXXXXX | 00000001 | 1 |

EMBEDDED CAM TEST STRUCTURE FOR FULLY TESTING ALL MATCHLINES

BACKGROUND OF THE INVENTION

The present invention generally relates to content addressable memories (CAMs) and more particularly to an improved CAM design that includes distinct boundaries at the matchline latches, allowing the matchlines and priority encoder to be completely tested.

Description of the Related Art

Content-Addressable Memories (CAMs) are used in applications where some known data may be stored in a memory but the address of the memory location holding the data is unknown. While CAMs may take on a number of forms, the simplest is a circuit similar in many ways to a Static Random Access Memory (SRAM), with the addition of a search function. During a search, data is provided via inputs to the memory which is then compared with the data in each address of the entire memory array (or some subset of the entire array) which will result in a "Match" (or "Hit") for those words (individual memory entries) whose stored data is bitwise equal to the incoming data and a "Mismatch" (or "Miss") for those words whose stored data differs by one or more bits to the incoming data. The results of the match are placed onto the matchlines, of which one exists for each word.

In prior embodiments of CAM designs, including those embedded CAMs used in ASIC design systems, the individual matchline outputs typically have not been available directly, but rather are made available to the user through a priority encoder, which prioritizes the addresses of all matching words and returns the single address which has the highest priority, along with a hit/miss signal which is active only if there is at least one matching word (note that some CAMs also include a multiple hit signal which is active only if there is more than one matching word). Differing priority schemes can be used, including returning the highest or the lowest matching address, and each scheme has concerns which affect the testability and, more specifically, the test patterns which are used to test the search function of the CAM.

Figure 1:
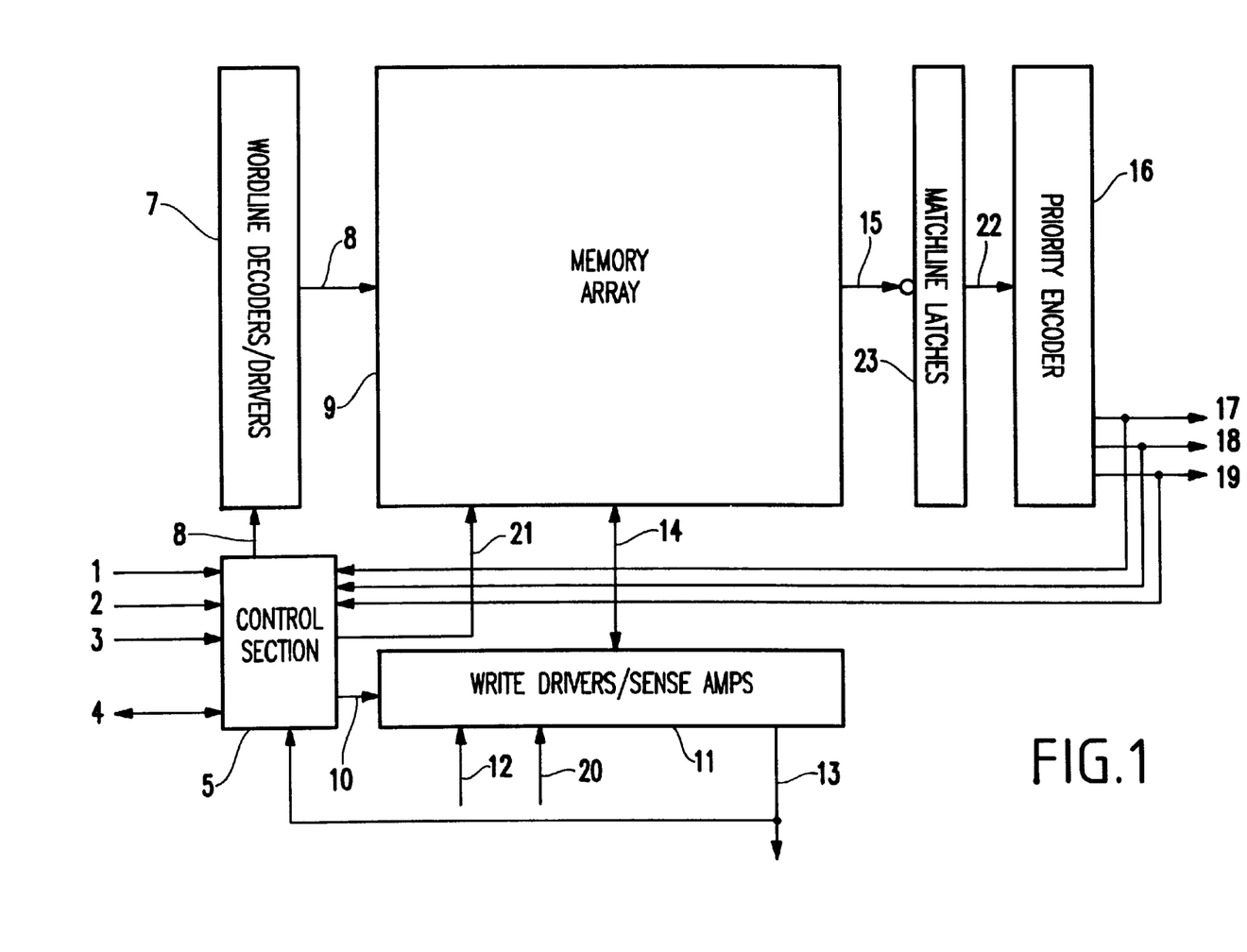
FIG. 1 is a schematic diagram of a logical representation of CAM architecture including self-test access through a priority encoder.

For instance, suppose a CAM has 64 words and a priority encoder which returns the lowest matching memory address. A logical representation of this CAM is shown in FIG. 1. Block S represents the control section of the CAM which receives a clock 1, address inputs 2, and control inputs 3, along with any test-related input or output signals 4. When the clock 1 is active during a read or write the local address 6 (which may be a multiplexed version of the functional and test address inputs) is sent to the wordline decoders and drivers 7, which turns on one of the wordlines 8, of which there is one for each word in the memory array 9. During a write operation, data is inputted through the data inputs 12 (and can be masked on a bitwise basis by bit-write mask inputs 20) into the write drivers 11 which drive the data onto the bidirectional read/write/search bitlines 14 and into the selected word. During a read operation, data is read from the selected word onto the differential read/write/search bitlines 14 into the sense amps (also 11) and through to the data outputs 13. During testing, the data 13 is also sent back to the control 5 where it is compared with the expected data contained in the test inputs 4. These operations are essentially the same as for a standard 1-port memory array.

When the clock 1 is active during a search operation, no wordline inputs 8 to the array 9 are selected. Instead, a search clock signal 21 is sent to every word in the array. Search data is inputted through the data inputs 12 (and can be masked on a bitwise basis by search mask inputs 20) into the write drivers 11 and onto the differential read/write/search bitlines 14. The data is then compared to every word in the array 9 during the active portion of the search clock 21, and the precharged matchlines 15 for every word are driven low (for a mismatch) or stay high (for a match) and latched in the matchline latches 23 whose outputs 22 are then sent into the priority encoder 16. The priority encoder 16 encodes the lowest matching address onto search address outputs 17, along with a hit/miss signal 18 and a multiple hit detect signal 19.

During test, all three of the outputs 17–19 from the priority encoder are also sent back to the control section 5 where they are compared with the expected value(s) contained in test inputs 4. This places limitations on the types of tests performed on the CAM. The only way to observe the outputs of a search operation during test is through these outputs. A mismatch on every word is simple to detect. A simple test is to write a "0" into every bit of every word of the memory array, then walk a "1" across a field of "0" s in the search data. For example, FIG. 2 shows a table which demonstrates the test sequence for a CAM which has 64 words with an 8-bit wide word.

Figure 2:
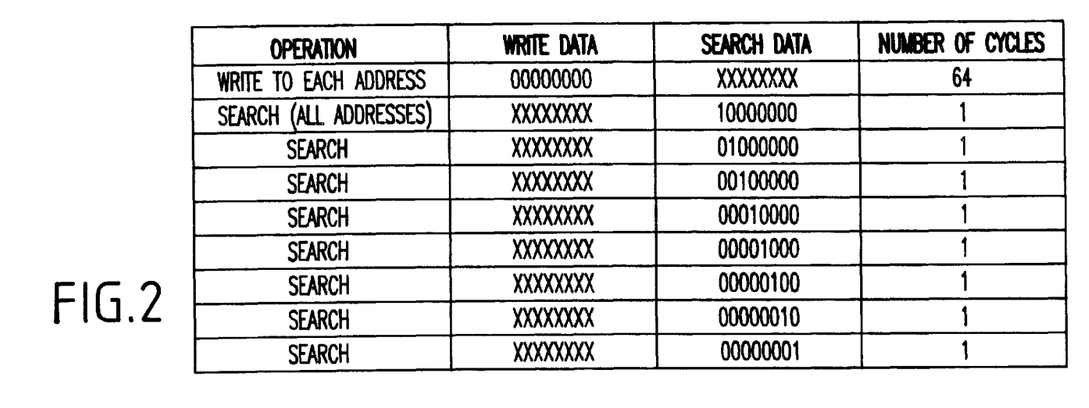
FIG. 2 is a schematic diagram of a table showing a matching "1" self-test pattern to detect a single-bit mismatch.

The test sequences in FIG. 2 cause a single-bit mismatch for each bit in every word (note that each search is implied to be all addresses). Each word is expected to mismatch for every search and, thus, if any word has a defect which causes it to match, the hit/miss signal will go active, causing the CAM to indicate that a fail has occurred. The test is repeated, writing a "1" to the entire array and marching a "0" across a field of "1"s.

Figure 3A:
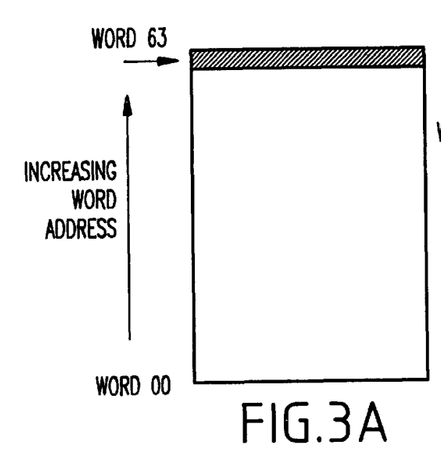
FIG. 3 is a schematic diagram of a CAM memory array showing a random selection of successive searches.
Figure 3B:
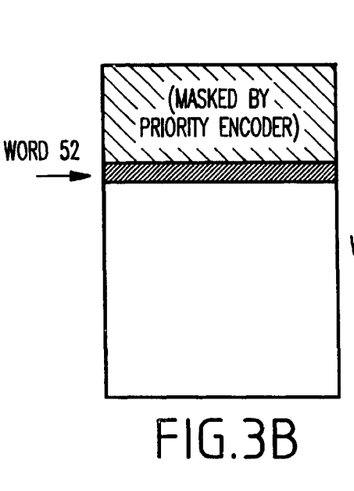
Figure 3C:
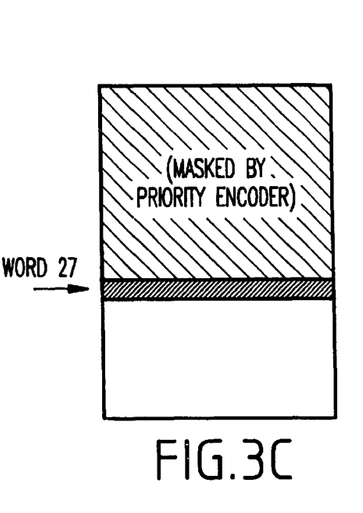

Testing for a match on every word, however, is more difficult, and when testing through a priority encoder cannot be done in a single cycle (and can never be done exhaustively), a "pull-the-blinds" approach is used, where the test is begun at the highest order address and proceeds to subsequently lower order addresses. FIG. 3 shows graphically a representation of the sequence in which the searches occur for a 64-word CAM whose priority encoder returns the lowest matching address.

In FIG. 3, the test begins by writing some data into the entire array (e.g., "0") to every cell. In the first cycle (a), some different data is written into the highest order address (word 63) (e.g., "1") to every cell in this word. A search is then conducted for the data in word 63, resulting in a match on this word. The address "63" appears as the output of the priority encoder and the hit/miss signal is set active to indicate that a match has occurred. This "write followed by search" sequence is repeated for each word in the CAM. For example, in subsequent cycles (b), the same new data (all "1") is written into and searched from each next lower address. On each subsequent search, multiple words match the data, but only the lowest matching address appears at the output of the priority encoder (e.g., word 52), and the hit/miss indicates a match. It should be evident that words 63–53 are now being "masked" by the priority encoder, and if there is some defect which causes any of words 63–53 to indicate a mismatch during a match on some other word, when it should actually be matching, the fault would go undetected.

To date, this has been a problem of untestability in all CAMs which provide match outputs as a priority encoded address; however, it is not generally considered to be a major limitation since the priority encoder is still functional as promised, in that it returns the lowest matching address. Embedded CAM designs which directly provide the match outputs are tested by a means other than selftest. Typically, functional test methods are used which are very costly to develop. methodology have, to date, contained priority encoders and have not directly offered matchline outputs due to the above-described test limitations.

SUMMARY OF THE INVENTION

In view of the foregoing and other problems, disadvantages, and drawbacks of the conventional CAMs, the present invention has been devised, and it is an object of the present invention to provide a structure and method for an improved CAM design.

In order to attain the objects suggested above, there is provided, according to one aspect of the invention, a content addressable memory structure which includes a memory array of words, each word has multiple memory bits. The invention includes a plurality of matchlines, each being connected to one of the words, and a self-test matchline compare circuit connected to the matchlines, adapted to individually test the match function for all of the words. Further, the invention includes a matchline compare circuit which has a plurality of comparators equal in number to the number of words, such that each word is connected to a dedicated comparator to allow each word in the memory array to be individually tested. The matchline compare circuit has first latches connected to the matchlines and second latches adapted to store compare data. The comparators are connected to the first latches and the second latches, and are adapted to compare data in the first latches with the second latches. The structure includes an equal number of words and first latches, such that each matchline is connected to a dedicated first latch. An override signal line is connected to the comparators and the comparators compare data in the first latches with data on the override signal line. The multiplexors are connected to the override signal line, the second latches, and the comparators. The control signal line is connected to the multiplexors, wherein the control signal line supplies a control signal that selects, as inputs, one of the override signal line and the second latches to be output from the multiplexors to the comparators. The structure includes an equal number of the words, the first latches, the second latches, the multiplexors, and the comparators, such that each word's match function is individually tested. The override signal line carries a test data pattern that does not match data in any word in the memory array.

The invention creates a distinct boundary at the matchline latches, allowing the matchlines to be completely tested during BIST and the priority encoder to be completely tested by logic test (providing the best test coverage of both circuits at an optimum cost savings).

BRIEF DESCRIPTION OF THE SEVERAL VIEWS OF THE DRAWINGS

The foregoing and other objects, aspects and advantages will be better understood from the following detailed description of the preferred embodiments of the invention with reference to the drawings, in which.

DETAILED DESCRIPTION OF THE INVENTION

Figure 4:
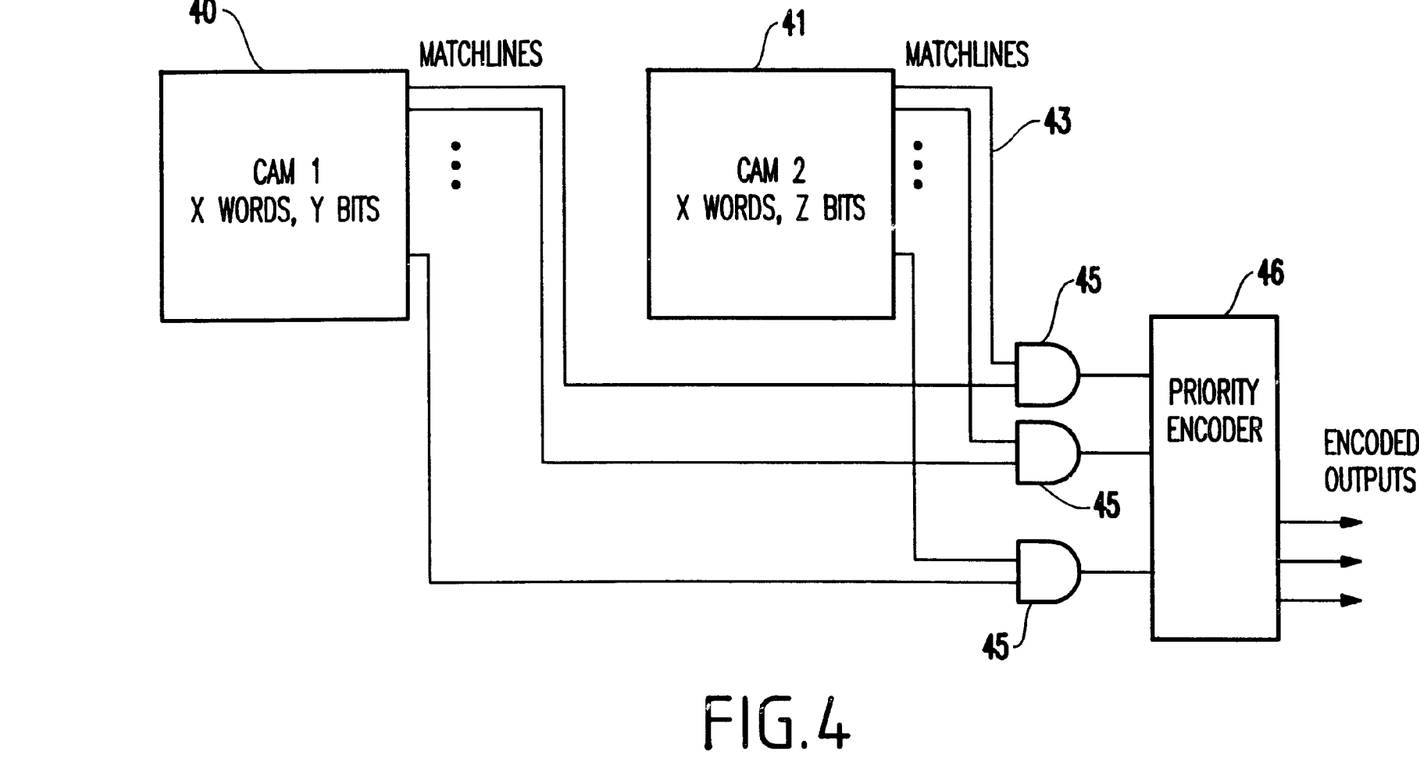
FIG. 4 is a schematic diagram of two CAMs tiled together to make a double-word-width CAM with an external single priority encoder.

Future CAM designs may avoid the use of a priority encoder and use matchline outputs directly. A problem arises when it is desired to use the matchline outputs of the array directly, rather than using them indirectly, through the priority encoder because with conventional CAM designs, it is not guaranteed that every matchline works correctly on every search. The approach of offering these outputs directly has not been done in previous embedded self-test CAM designs, though there are a number of beneficial applications which justify using the matchline outputs directly. For instance, FIG. 4 shows how two individually self-tested embedded CAMs 40, 41 may be tiled together by ANDing (45) the matchlines 43 together in order to build a CAM which has a maximum word width of up to twice the standard offering (i.e., two 128-bit CAMs can be tiled together to create a single 256-bit CAM). Even wider word widths can be created by tiling additional CAMs. This is doubly useful in that some customers desire a configurable word width in their systems (i.e., four 72-bit CAMS that can also be accessed as two 144-bit CAMs or one 288-bit CAM through separate priority encoders). Offering the matchlines to the customer provides such flexibility.

The priority encoder(s) 46 for this setup can be built from standard-cell gates in the chip-level netlist, outside of the CAM macro, which leads to a second advantage of offering the matchline outputs to the user of the CAM. A priority encoder can be custom-built to match the application of the CAM in the chip rather than being locked into the encoding scheme designed into the CAM. Not only is this a benefit to the customer, but it also frees up the CAM designer from a great deal of work, particularly in the area of timing. It is extremely difficult (and expensive in terms of computing power) to find the critical path through a priority encoder; however, by designing the priority encoder outside of the CAM, the chip designer can take advantage of many standard logic tools, including static timing analyzers, making the task of timing the priority encoder trivial.

Yet another benefit of the present invention is related to the fact that CAMs are often used as translation look-aside buffers (TLBs) in conjunction with a separate memory (usually SRAM). When a search is performed on the CAM, the output matchline is encoded into a single address which is sent to the associated memory where the encoded address is subsequently decoded into a single wordline. Offering the matchlines to the customer opens up the possibility of providing an associated SRAM whose wordline drivers are directly available as inputs (rather than going through a decoder), thus eliminating the delay of encoding-decoding.

Because of these and other benefits of the present invention, it is possible to offer the option of providing the search outputs either through a low-order priority encoder or through the matchline outputs directly. In order to do this, the invention described below allows each matchline to be tested individually to ensure complete search functionality which is promised to the customer.

Figure 5:
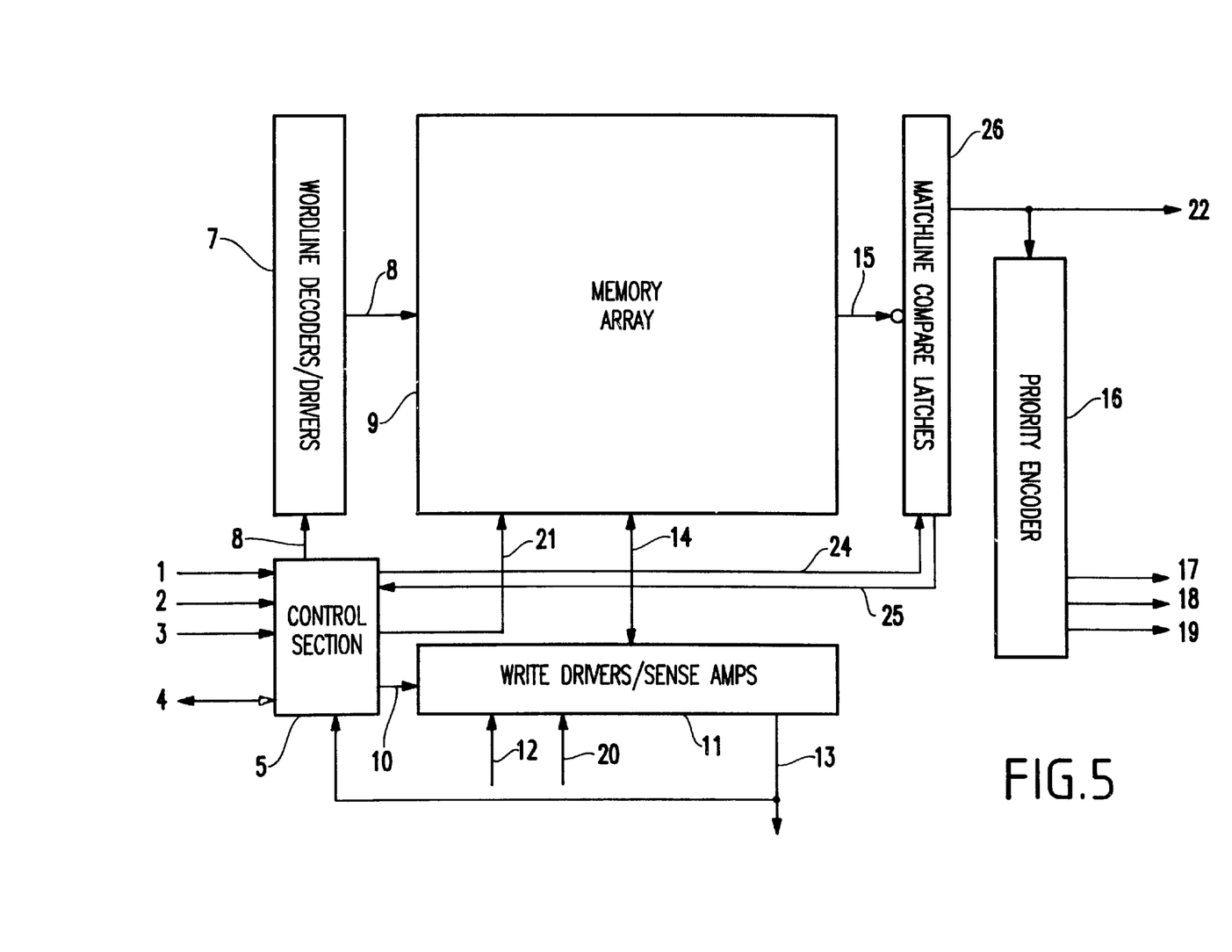
FIG. 5 is a schematic diagram of a CAM showing a preferred embodiment of the invention.
Figure 6:
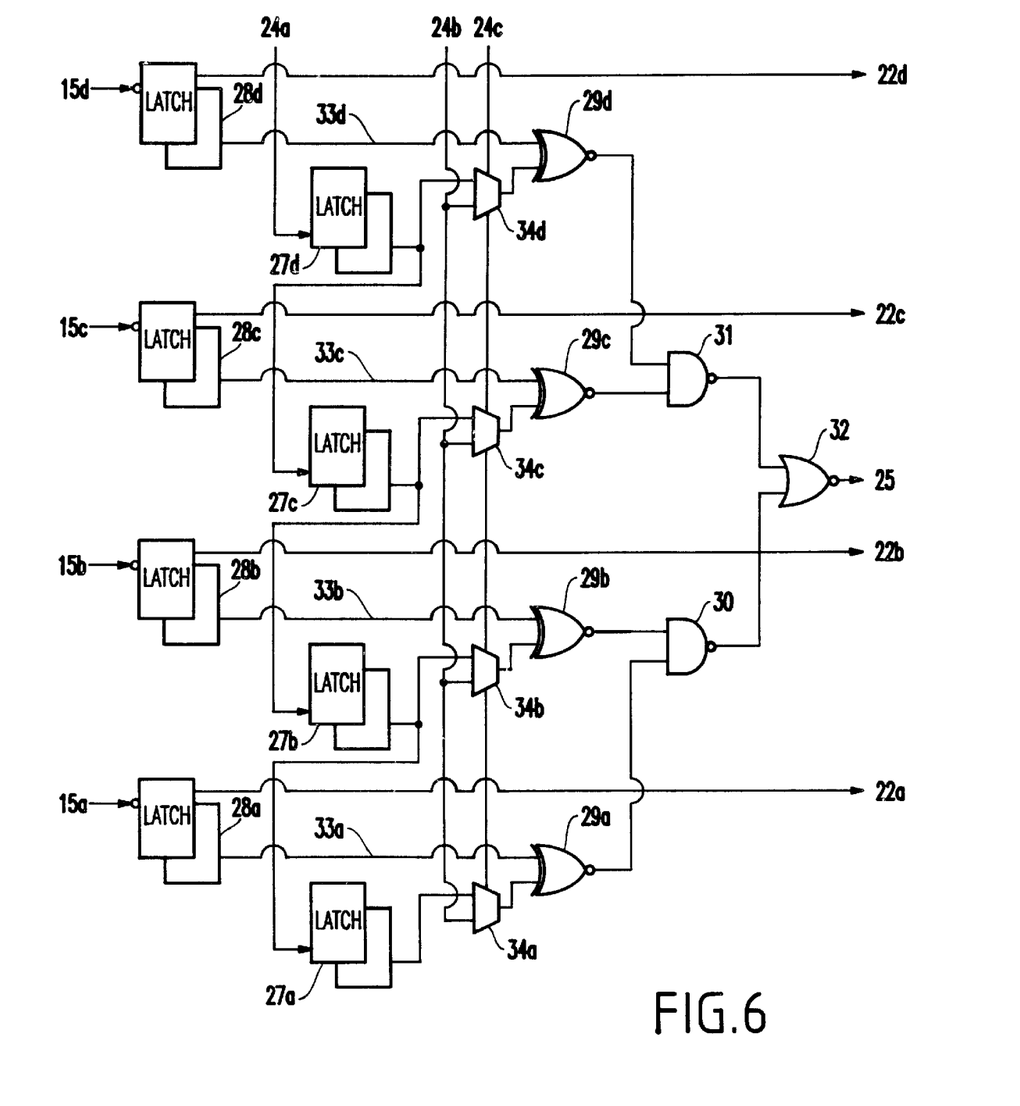
FIG. 6 is a schematic diagram of a matchline self-test compare circuit.

A preferred embodiment of the invention is shown in FIG. 5 as a modified 4-word version of the logical representation of a CAM architecture shown in FIG. 1. The priority encoder 16 is still shown, but is now optional and is external to the embedded CAM design. The matchlines 15 are now sent into a matchline compare circuit 26, which, as shown in FIG. 6, contains, in addition to the matchline latches 28a–28d (shown in FIG. 1 as block 23), a shift register comprised of latches 27a–27d whose input 24a comes from one of the test inputs 4 and a comparison circuit comprised of logic gates 29a–32, whose output 25 is inputted to the control circuit 5 and out through the test outputs 4. Note that FIG. 6 shows only four wordlines and their associated compare circuits, but the shift register and compare circuit can be extended to include any number of matchline outputs.

During test of the search function, the matchline latches 28a–28d are loaded with the match results for each word on the matchlines 15a–15d, respectively. The match compare shift register 27a–27d has been previously loaded with the expected results of the search. The match compare shift register override multiplexers 34a–34d are controlled by match compare shift register override select signal 24c and select the logic value to which the matchlines will be compared, which will either come from the match compare shift register 27a–27d or the alternate match compare signal 24b. The multiplexers 34a–34d allow the flexibility of including such test patterns as searching and expecting a match or mismatch on all words (where select signal 24c is high to select the alternate match compare signal 24b, which is high to indicate all matches or low to indicate all mismatches) followed immediately by a match on only some words (select signal 24c is low to select the output of the match compare shift register 27a–27d), which is a desireable test pattern to test proper operation of the matchlines.

The XNOR gates 29a–29d compare the results with the expected results, and logic gates 30–32 compress the compare results into compare signal 25 which is active high if the matchline values are equal to the expected values. Note that, in order to provide fast access to the matchline outputs, matchlines 22a–22d come from the L1 (master) output of the latches 28a–28d, respectively, while 33a–33d comes from the L2 (slave) output of the same latches, respectively, following standard LSSD (Level Sensitive Scan Design) design-for-test guidelines.

Figure 7A:
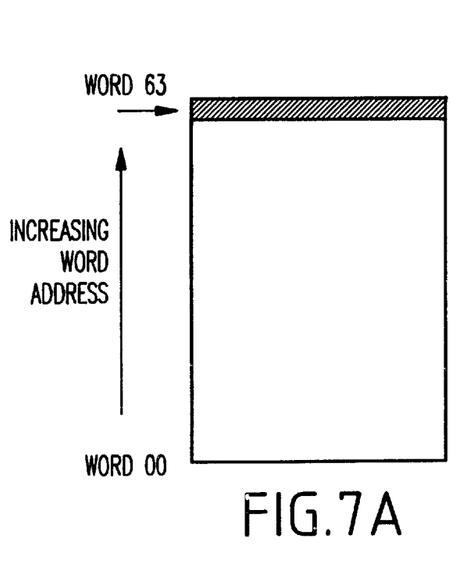
FIG. 7 is a schematic diagram of a CAM memory array showing a random selection of successive searches.
Figure 7B:
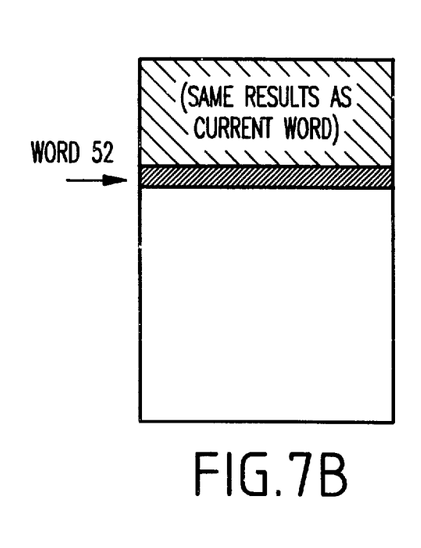
Figure 7C:
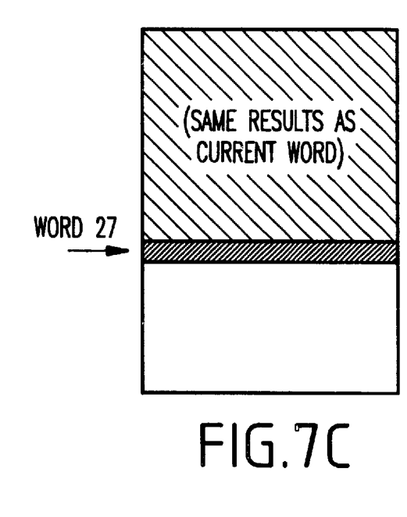
Figure 8:
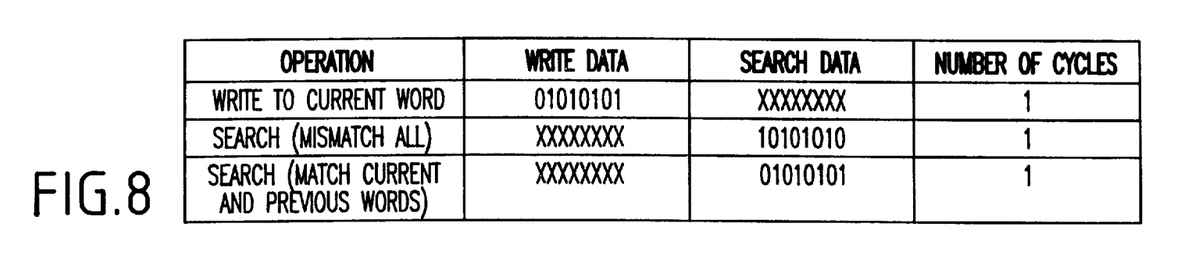
FIG. 8 is a schematic diagram of self-test patterns performed on each word to test search function.

It should be evident that this test structure offers tremendous flexibility in testing the search function of the CAM. It is no longer required to use a "pull-the-blinds" test because every matchline output is observable. An example is presented here which illustrates the improved test coverage using the previous example described in FIG. 3. FIG. 7 shows graphically a representation of the sequence in which the searches occur for a 64-word CAM which implements the invention described. FIG. 7 is nearly identical to FIG. 3; however, now the words that were previously masked by the priority encoder (those of lower priority [higher order]) are now completely testable due to the new structure. FIG. 8 shows a detail of the operations which are performed on each address of this CAM with 64 words and 8 bits per word, for example, word 63(a). The CAM has previously been written with "0" to all cells (and optionally read to verify the contents) and the match compare shift register has been loaded with all "1" to indicate a mismatch on all words.

Each of the operations listed in FIG. 8 is performed sequentially on a single address before the test moves to the next address. For ease of implementation in BIST (built-in self-test), this is still implemented as a "pull-the-blinds" test; however, as previously mentioned, this is not a requirement. Examining the operation for word 63 shown in FIG. 8 in greater detail:

First, the word is written with some arbitrary data other than that contained in lower-order addresses. The lower-order words contain "00000000," so a "01010101" pattern is written into word 63. A shift operation also occurs, shifting a "0" into the match compare shift register to indicate a "match" on word 63.

Secondly, a search is then performed with a third data pattern which is not contained anywhere in the CAM, in this case "10101010." The intent of this operation is to cause a mismatch on all words and fully discharge every matchline in order to subsequently test the restore devices for the matchlines. This is made possible by the multiplexers in the invention.

Thirdly, a search is performed on the data pattern contained in word 63 ("01010101"), causing a match on this word and a mismatch on all lower-order words. This is made possible by the shift register 27a–27d and the XNOR compare gates 29a–29d.

After these three operations are completed on word 63, the operations are repeated on word 62, then word 61, etc. The new data which is written in the first of the operations remains in each word as the address decrements and the shift register continues shifting a "0" into all the same higher-order words, thus resulting in an increasing field of matches during the third operation (shown as the shaded portion of FIGS. 7(a–c)). These matches are all testable via the match compare shift register and compare circuits.

The invention is not limited to being tested with this pattern, nor is this pattern limited by the specific data pattern employed. Also, this specific test pattern can be performed in either incrementing or decrementing order, but is constrained by the direction of the shift register. The shift register can also be designed such that, i.e., with the addition of a multiplexer, it is programmably bidirectional.

The shift register (in any direction) comprises one matchline latch per word in an embedded CAM. The multiplexer per matchline allows the test to switch the expected matchline data between the shift register or some other data (e.g., a single signal to indicate all matches or all mismatches). A test pattern can comprise 1) a search resulting in a mismatch on all words and 2) a search resulting in a match on some or all words.

Prior embodiments of ASIC CAM designs have incorporated a priority encoder whose outputs were tested by BIST, as shown in FIG. 1. In order to provide matchline outputs directly, it must be guaranteed by testing, using BIST, that these outputs function properly. Other CAM designs have been tested with functional patterns which do not provide comprehensive test coverage. The invention creates a distinct boundary at the matchline latches, allowing the matchlines to be completely tested during BIST and the priority encoder to be completely tested by logic test (providing the best test coverage of both circuits at an optimum cost savings).

While the invention has been described in terms of preferred embodiments, those skilled in the art will recognize that the invention can be practiced with modification within the spirit and scope of the appended claims.

What is claimed is:

1. A content addressable memory structure comprising:
   a memory array of words, each word having multiple memory bits;

a plurality of matchlines, each of said matchlines being connected to one of said words; and matchline compare circuit connected to said matchlines and being adapted to test all of said words individually, wherein said matchline compare circuit comprises:
first latches connected to said matchlines;
second latches adapted to store compare data; and
comparators connected to said first latches and said second latches and adapted to compare data in said first latches with said second latches.

2. The structure in claim 1, wherein said structure includes an equal number of words and first latches, such that each matchline is connected to a dedicated first latch.

3. The structure in claim 1, further comprising an alternate match compare signal line connected to said comparators, wherein said comparators compare data in said first latches with data on said alternate match compare signal line.

4. The structure in claim 3, further comprising:
multiplexors connected to said alternate match compare signal line, said second latches, and said comparators; and
a control signal line connected to said multiplexors, said control signal line supplying a control signal that selects, as inputs, one of said alternate match compare signal line and said second latches to be output from said multiplexors to said comparators.

5. The structure in claim 4, wherein said structure includes an equal number of said words, said first latches, said second latches, said multiplexors, and said comparators, such that each word is individually tested by said matchline compare circuit.

6. The structure in claim 4, wherein said alternate match compare signal line carries a test data pattern that does not match data in any word in said memory array.

7. A content addressable memory structure comprising:
a memory array of words, each word having multiple memory bits;
a plurality of matchlines, each of said matchlines being connected to one of said words; and
a matchline compare circuit connected to said matchlines and being adapted to test all of said words individually,
wherein said matchline compare circuit includes a plurality of comparators equal in number to a number of said words, such tat each word is connected to a dedicated comparator to allow each word in said memory array to be individually tested,
wherein said matchline compare circuit comprises:
first latches connected to said matchlines; and
second latches adapted to store compare data, and
wherein said comparators are connected to said first latches and said second latches and are adapted to compare data in said first latches with said second latches.

8. The structure in claim 7, wherein said structure includes an equal number of words and first latches, such that each matchline is connected to a dedicated first latch.

9. The structure in claim 8, further comprising an alternate match compare signal line connected to said comparators, wherein said comparators compare data in said first latches with data on said alternate match compare signal line.

10. The structure in claim 9, further comprising:
multiplexors connected to said alternate match compare signal line, said second latches, and said comparators; and
a control signal line connected to said multiplexors, said control signal line supplying a control signal that selects, as inputs, one of said alternate match compare signal line and said second latches to be output from said multiplexors to said comparators.

11. The structure in claim 10, wherein said structure includes an equal number of said words, said first latches, said second latches, said multiplexors, and said comparators, such that each word is individually tested.

12. The structure in claim 10, wherein said alternate match compare signal line carries a test data pattern that does not match data in any word in said memory array.

13. A content addressable memory structure comprising:
a memory array of words, each word having multiple memory bits;
a plurality of matchlines, each of said matchlines being connected to one of said words; and
a built-in self test (BIST) circuit comprising registers for storing output from said matchlines and comparators for testing data in said registers,
wherein each word is connected to a dedicated comparator to allow each word in said memory array to be individually tested,
wherein said BIST circuit comprises:
first latches connected to said matchlines; and
second latches adapted to store compare data, and
wherein said comparators are connected to said first latches and said second latches and are adapted to compare data in said first latches with said second latches.

14. The structure in claim 1, wherein said structure includes an equal number of words and first latches, such that each matchline is connected to a dedicated first latch.

15. The structure in claim 1, further comprising an alternate match compare signal line connected to said comparators, wherein said comparators compare data in said first latches with data on said alternate match compare signal line.

16. The structure in claim 15, further comprising:
multiplexors connected to said alternate match compare signal line, said second latches, and said comparators; and
a control signal line connected to said multiplexors, said control signal line supplying a control signal that selects, as inputs, one of said alternate match compare signal line and said second latches to be output from said multiplexors to said comparators.

17. The structure in claim 16, wherein said structure includes an equal number of said words, said first latches, said second latches, said multiplexors, and said comparators, such that each word is individually tested by said BIST circuit.

* * * * *